United States Patent
Zhu et al.

(10) Patent No.: US 9,031,622 B2
(45) Date of Patent: May 12, 2015

(54) ELECTRONIC DEVICE EMPLOYING CONNECTING MECHANISM

(71) Applicants: Fu Tai Hua Industry (Shenzhen) Co., Ltd., Shenzhen (CN); Hon Hai Precision Industry Co., Ltd., New Taipei (TW)

(72) Inventors: Tai-Shan Zhu, Shenzhen (CN); Che-Yu Chou, New Taipei (TW); Wen-Chih Lan, New Taipei (TW); Hai-Qian Ge, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 157 days.

(21) Appl. No.: 13/846,932

(22) Filed: Mar. 18, 2013

(65) Prior Publication Data

US 2013/0258566 A1   Oct. 3, 2013

(30) Foreign Application Priority Data

Mar. 28, 2012  (CN) .......................... 2012 1 0085972

(51) Int. Cl.
*H04M 1/00* (2006.01)
*H05K 5/03* (2006.01)
*H04M 1/02* (2006.01)

(52) U.S. Cl.
CPC ............... *H05K 5/03* (2013.01); *H04M 1/0237* (2013.01)

(58) Field of Classification Search
USPC ....................... 361/679.56, 679.55; 455/575.4
See application file for complete search history.

(56) References Cited

U.S. PATENT DOCUMENTS

| | | | | |
|---|---|---|---|---|
| 6,768,635 | B2 * | 7/2004 | Lai et al. ................... | 361/679.11 |
| 6,963,756 | B2 * | 11/2005 | Lubowicki et al. ......... | 455/550.1 |
| 7,983,725 | B2 * | 7/2011 | Zhang et al. ............... | 455/575.4 |
| 8,089,758 | B2 * | 1/2012 | Zhu et al. .................. | 361/679.58 |
| 8,411,421 | B2 * | 4/2013 | Naito ......................... | 361/679.01 |
| 8,547,700 | B2 * | 10/2013 | Duan et al. .................... | 361/727 |
| 8,634,196 | B2 * | 1/2014 | Liu et al. ....................... | 361/727 |
| 8,797,730 | B2 * | 8/2014 | Duan et al. ............... | 361/679.27 |
| 2007/0238494 | A1 * | 10/2007 | Pan ........................... | 455/575.4 |
| 2008/0261666 | A1 * | 10/2008 | Niitsu et al. ............... | 455/575.4 |
| 2009/0093285 | A1 * | 4/2009 | Weng et al. ................ | 455/575.4 |
| 2009/0212675 | A1 * | 8/2009 | Zhang et al. ................... | 312/237 |
| 2009/0233659 | A1 * | 9/2009 | Ke et al. ...................... | 455/575.3 |
| 2011/0157036 | A1 * | 6/2011 | Yang ............................. | 345/173 |
| 2011/0188187 | A1 * | 8/2011 | Barnett et al. ............ | 361/679.01 |
| 2011/0242740 | A1 * | 10/2011 | Seah ........................ | 361/679.01 |
| 2012/0325032 | A1 * | 12/2012 | Hsu ............................... | 74/89.22 |

* cited by examiner

*Primary Examiner* — Lisa Lea Edmonds
(74) *Attorney, Agent, or Firm* — Novak Druce Connolly Bove + Quigg LLP

(57) ABSTRACT

An electronic device includes a housing defining a receiving space framed by a plurality of side walls with an opening defined on a top surface of the housing. A cover is movable relative to the top surface. A connecting mechanism connects the housing with the cover. The connecting mechanism includes a transmission apparatus received in the housing and is exposed out of the housing via the opening, engaging with the cover, a moveable position apparatus is assembled with the transmission apparatus moving along the transmission apparatus, a latching apparatus is arranged on one side wall of the housing to latch the position apparatus. When the cover is moved to a first side of the housing, the position apparatus latches the latching apparatus. When the latching apparatus is released from the position apparatus, the cover slides to a second side opposite to the first side of the housing automatically.

20 Claims, 15 Drawing Sheets

ELECTRONIC DEVICE EMPLOYING CONNECTING MECHANISM

BACKGROUND

1. Technical Field

The present disclosure relates to an electronic device employing a connecting mechanism.

2. Description of Related Art

An electronic device such as a slider phone includes a housing, a cover slidable relative to the housing, and a connecting mechanism connecting the cover to the housing. The connecting mechanism includes a position apparatus, which is used to keep the cover covering a set position of the housing. However, when the cover is needed to slide to another position, the position apparatus may need to be manually operated, this may be inconvenient.

Therefore, an electronic device employing a connecting mechanism to overcome the above described shortcoming is desired.

BRIEF DESCRIPTION OF THE DRAWINGS

The components in the drawings are not necessarily drawn to scale, the emphasis instead being placed upon clearly illustrating the principles of at least one embodiment. In the drawings, like reference numerals designate corresponding parts throughout the various views.

DETAILED DESCRIPTION

Reference will be made to the drawings to describe various embodiments in detail.

Figure 1:
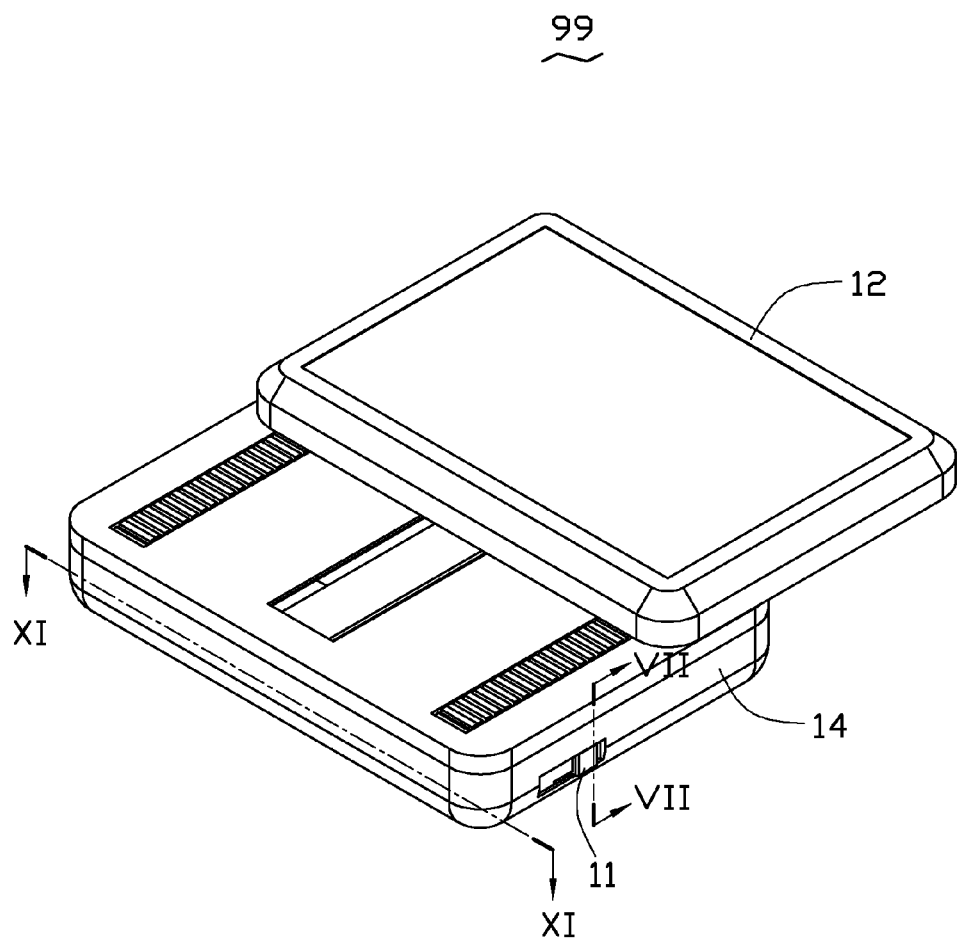
FIG. 1 is an isometric view of an electronic device (for example, a slider phone) employing a connecting mechanism according to one embodiment.

FIG. 1 shows an electronic device 99, which may be a slider phone, or a notebook computer, for example. In the illustration, the electronic device 99 is a slider phone. The electronic device 99 includes a housing 14, a cover 12 mounted on the housing 14 and movable relative to the housing 14, and a connecting mechanism 11 connecting the housing 14 with the cover 12. The connecting mechanism 11 is arranged in the housing 14, and a portion of the connecting mechanism 11 is exposed out from a top surface of the housing 14. In the illustration, the cover 12 is slidable on the top surface of the housing 14. When the cover 12 is located at one side of the top surface of the housing 14 and at least a portion of the top surface of the housing 14 is exposed the electronic device 99 is in a first state. When the cover 12 slides to the opposite side of the top surface, the cover 12 covers the top surface of the housing 14 completely; the electronic device 99 is in a second state.

Figure 2:
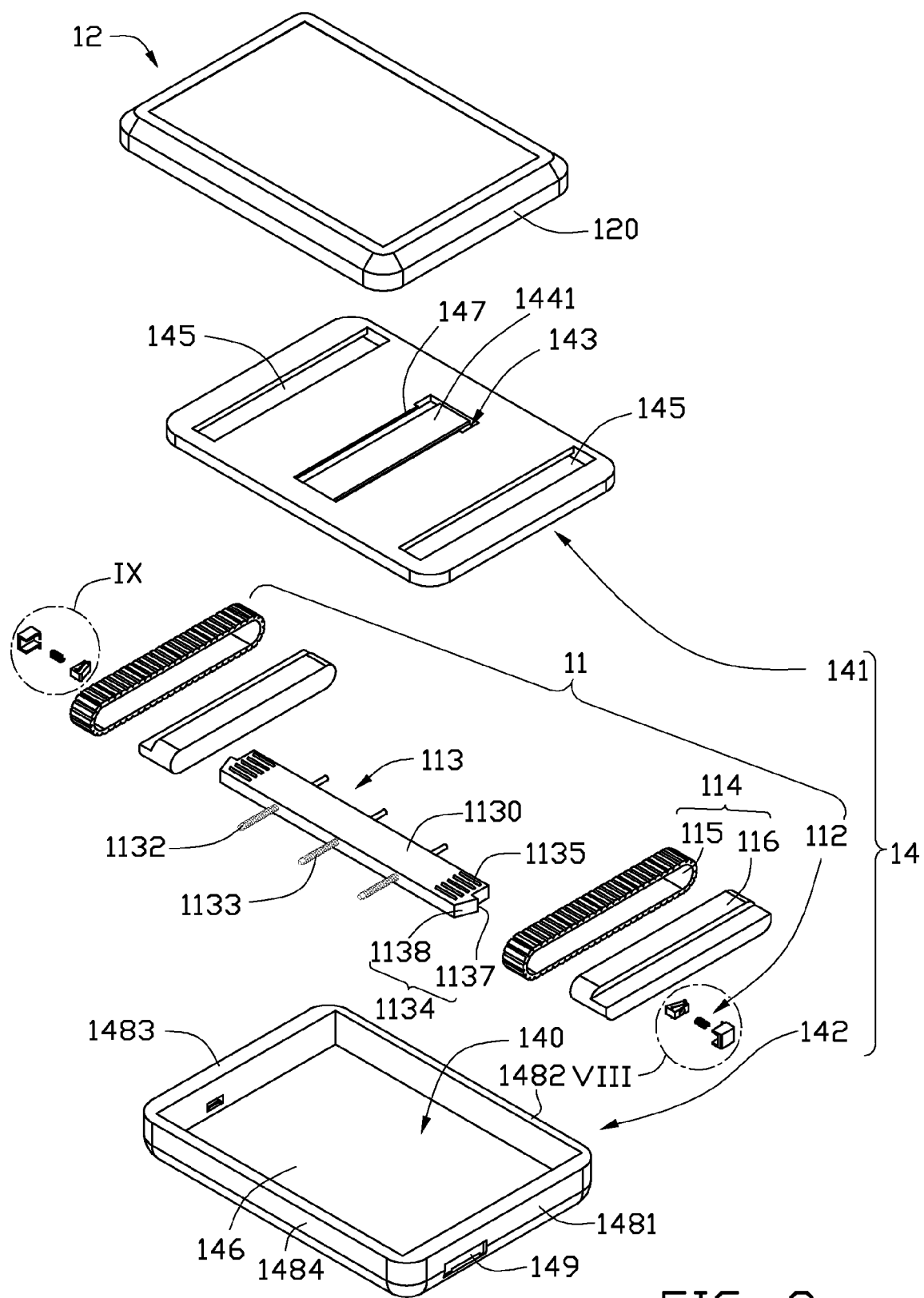
FIG. 2 is an exploded view of the electronic device of FIG. 1.
Figure 3:
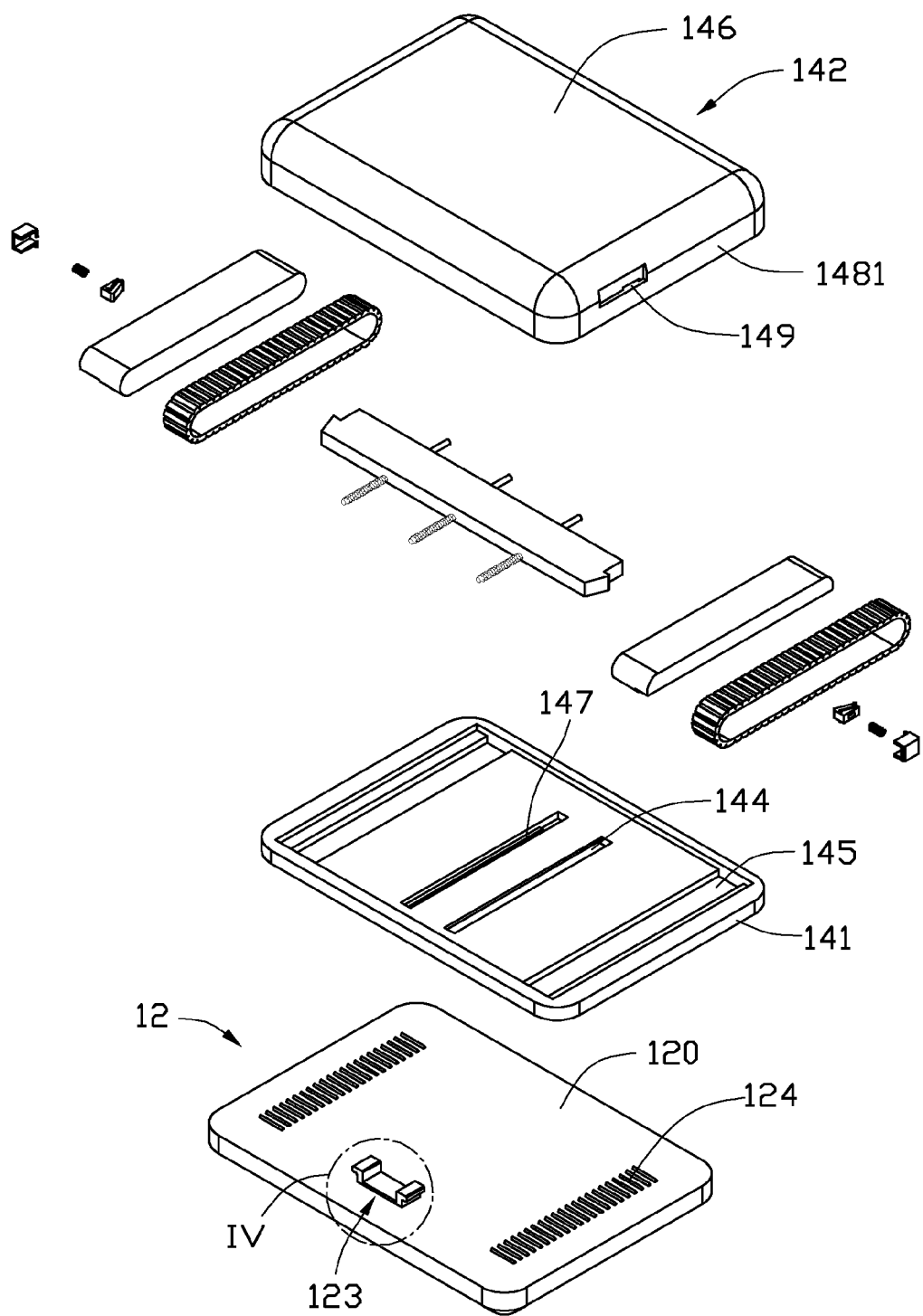
FIG. 3 is another exploded view of the electronic device of FIG. 1, but showing different view.
Figure 4:
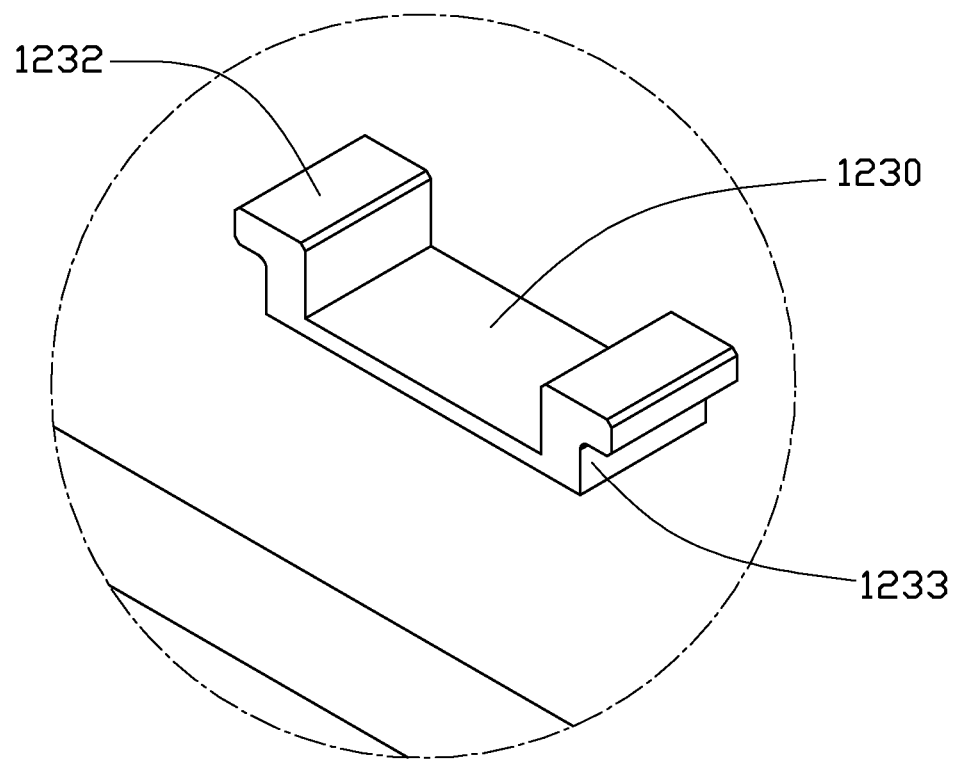
FIG. 4 is an enlarged view of a circled part IV of FIG. 3.

FIGS. 2-4 show that the cover 12 includes a main body 120, a slider 123, and at least one first rack 124. The slider 123 and the first rack 124 are arranged at a bottom of the main body 120 facing the housing 14. The slider 123 may directly extend from a bottom surface of the main body 120. The slider 123 includes a base plate 1230 and two sliding plates 1232. The base plate 1230 contacts the bottom surface of the main body 120. The two sliding plates 1232 extend from the base plate 1230. The two sliding plates 1232 are L-shaped; and they are symmetrical. The two sliding plates 1232 and the main body 120 corporately define two sliding grooves 1233. The two sliding grooves 1233 define moving directions of the cover 12 when the cover 12 moves relative to the housing 14. In the embodiment, the cover 12 includes two first racks 124 on opposite sides of the slider 123.

The housing 14 includes an upper casing 141, and a lower casing 142. The upper casing 141 and the lower casing 142 define a receiving space 140 receiving the connecting mechanism 11. The upper casing 141 defines at least one first opening 143 and at least one second opening 145. The first opening 143 is moveably aligned with the slider 123 and receives the slider 123. The second opening 145 corresponds to the first rack 124, the number of the second openings 145 matches with the number of the first racks 124. The upper casing 141 defines two first openings 143 corresponding to the two sliding plates 1232. A baffle 1441 is arranged between and spaces apart the two first openings 143. Two supporting plates 147 laterally extend from a top surface of the upper casing 141 and protrude into the first openings 143 so that each supporting plate 147 covers a long side of a corresponding first opening 143. The length of the supporting plate 147 is less than the length of the corresponding first opening 143. Each supporting plate 147 is received in the corresponding sliding groove 1231 and the main body 120 is movable along the moving direction guided by the slider 123 sliding on the supporting plate 147.

The lower casing 142 includes a bottom wall 146, a first side wall 1481, a second side wall 1482, a third side wall 1483, and a fourth side wall 1484. The first side wall 1481, the second side wall 1482, the third side wall 1483, and the fourth side wall 1484 extend from an edge of the bottom wall 146. The first side wall 1481 is opposite to the third side wall 1483 and may be parallel to the third side wall 1483. A controlling portion 149 is formed at the first side wall 1481 and cooperates with the connecting mechanism 11 to lock the main body 120 and the housing 14 at a set position. Another controlling portion 149 may be formed at the third side wall 1483.

The connecting mechanism 11 includes a latching apparatus 112, a position apparatus 113, and a transmission apparatus 114. The transmission apparatus 114 is received in the housing 14 and engages with the cover 12. The position apparatus 113 is assembled with the transmission apparatus 114 and moves following a motion of the transmission apparatus 114. The latching apparatus 112 is arranged on the first side wall 1481 corresponding to the controlling portion 149. When the latching apparatus 112 latches the position apparatus 113 and holds the cover 12 at a set position, the electronic device 99 remains in the first state. If the electronic device 99 is operated manually to change the working state, the latching apparatus 112 releases the position apparatus 113, and the transmission apparatus 114 drives the cover 12 to move.

The transmission apparatus 114 includes a continuous track 115 and a base 116. The base 116 supports the continuous track 115 in the housing 14. The continuous track 115 meshes with the first rack 124 and the position apparatus 113. The continuous track 115 surrounds the base 116, rotating along a first rotation direction when driven by the first rack 124 and rotating along a second rotation direction when driven by the position apparatus 113. The second rotation direction is reverse to the first rotation direction. In one embodiment, the transmission apparatus 114 includes two continuous tracks 115 corresponding to the two first racks 124. The continuous track 115 is exposed via the second opening 145.

The position apparatus 113 includes a main plate 1130, a position member 1134, a plurality of posts 1132, and a plurality of first restoration members 1133. The plurality of posts 1132 penetrate through the main plate 1130. One end of each post 1132 is connected with the fourth side wall 1484 mounting the post on the fourth side wall 1484. The post 1132 extends parallel to the moving direction of the cover 12. The main plate 1130 is supported by the posts 1132 and slidable on the posts 1132 along the extending direction of the post 1132. The first restoration members 1133 are arranged between the fourth side wall 1484 and the main plate 1130 and apply a restoration force on the main plate 1130. In one embodiment, the first restoration member 1133 is a spring which sleeves the post 1132. The position member 1134 is formed at two opposite ends of the main plate 1130 and configured to engage with the latching apparatus 112. The position member 1134 may be a hook portion, and includes a resisting surface 1137 and a guiding surface 1138. The guiding surface 1138 is a surface inclined to the extending direction of the post 1132 and the resisting surface 1137. The main plate 1130 includes two second racks 1135 on the two opposite ends of the main plate 1130 to mesh the continuous track 115.

Figure 5:
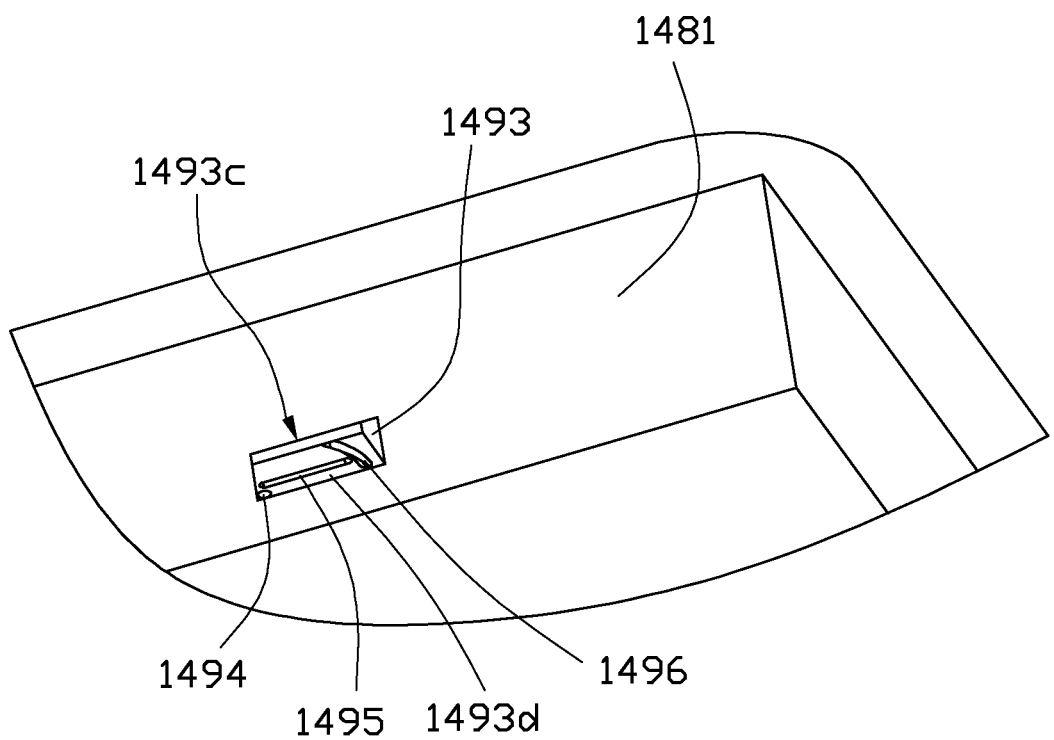
FIG. 5 is a partial isometric view of the electronic device which has a controlling portion of the connecting mechanism.
Figure 6:
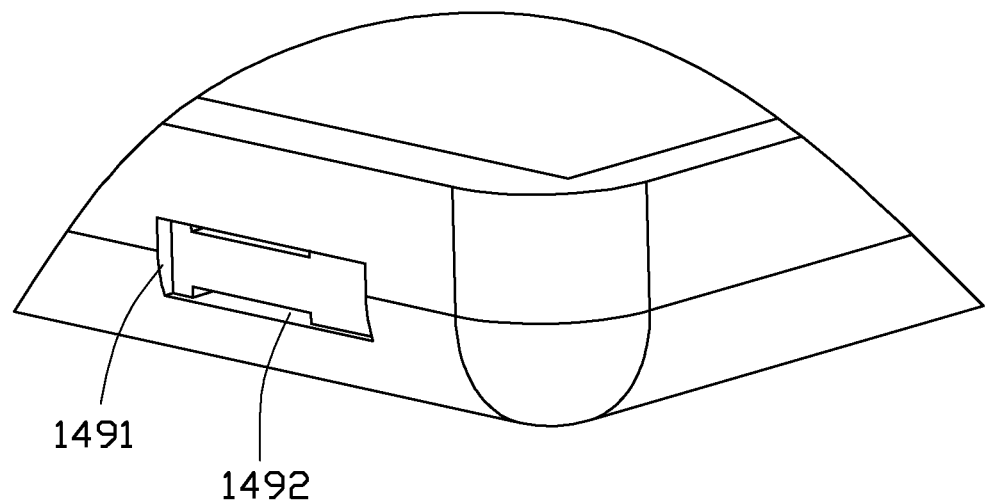
FIG. 6 is similar to FIG. 5, but showing the controlling portion of the connecting mechanism in another view.
Figure 7:
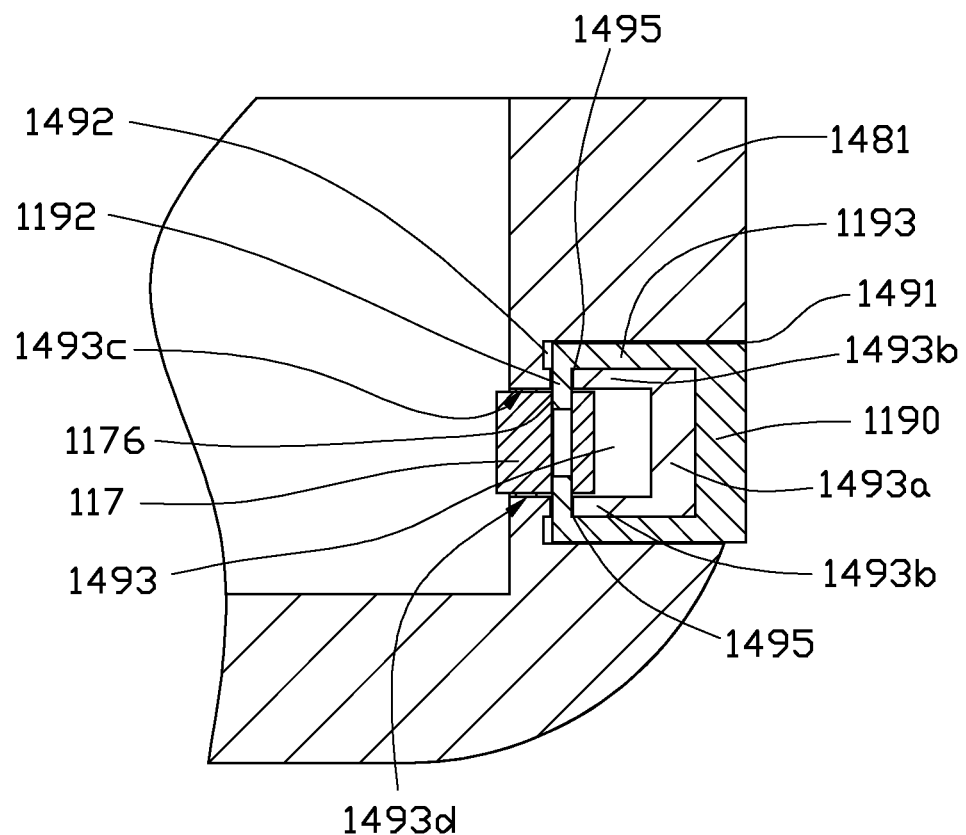
FIG. 7 is a sectional view of FIG. 1 along line VII-VII.

FIGS. 5-7 show that the controlling portion 149 defines a first groove 1491, at least one second groove 1492, and a third groove 1493. The first groove 1491 is separated from the third groove 1493 by a first spacing plate 1493a. The third groove 1493 faces the receiving space 140. The first groove 1491 is defined opposite to the third groove 1493. In this embodiment, the controlling portion 149 defines two second grooves 1492 at opposite sides of the first spacing plate 1493a. The third groove 1493 includes an upper surface 1493c and a lower surface 1493d. A fixing hole 1494, a second slideway 1495 and a third slideway 1496 are defined in each of the upper surface 1493c and the lower surface 1493d. The second slideway 1495 is defined between the fixing hole 1494 and the third slideway 1496. The second slideway 1495 is parallel to the first side wall 1481. The third slideway 1496 is arcuate.

Figure 8:
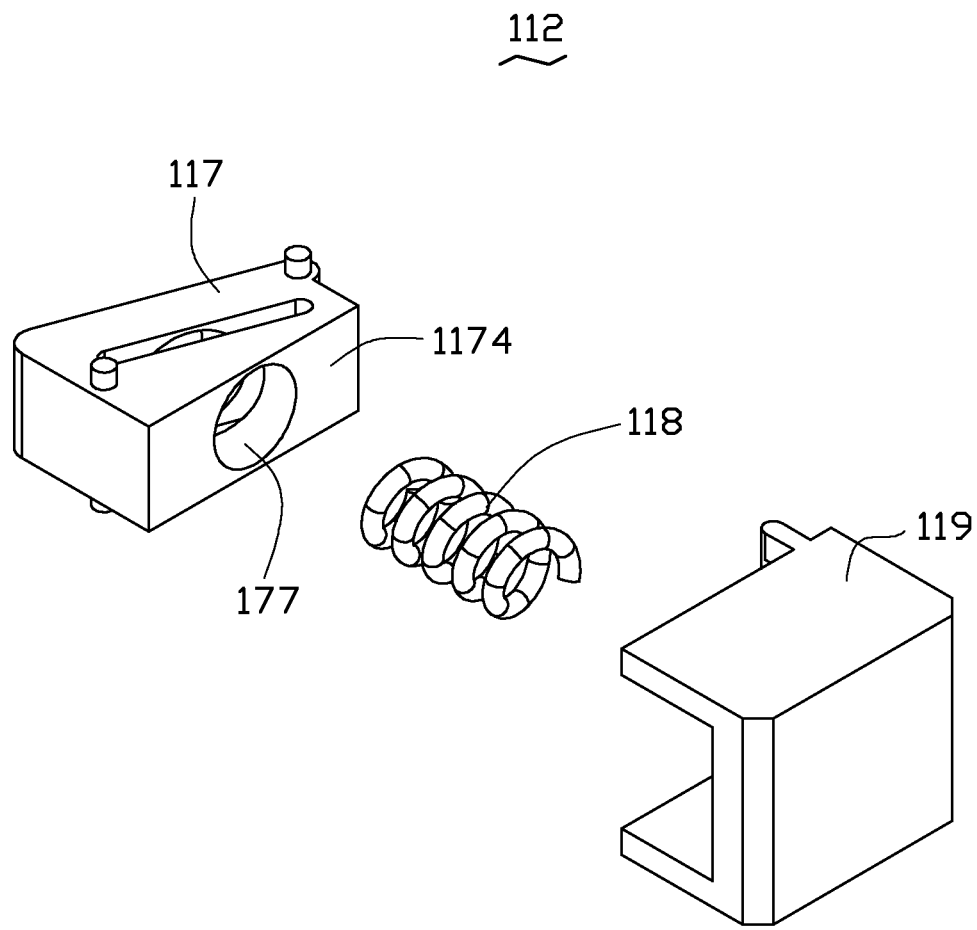
FIG. 8 is an enlarged view of a circled part VIII of FIG. 2.
Figure 9:
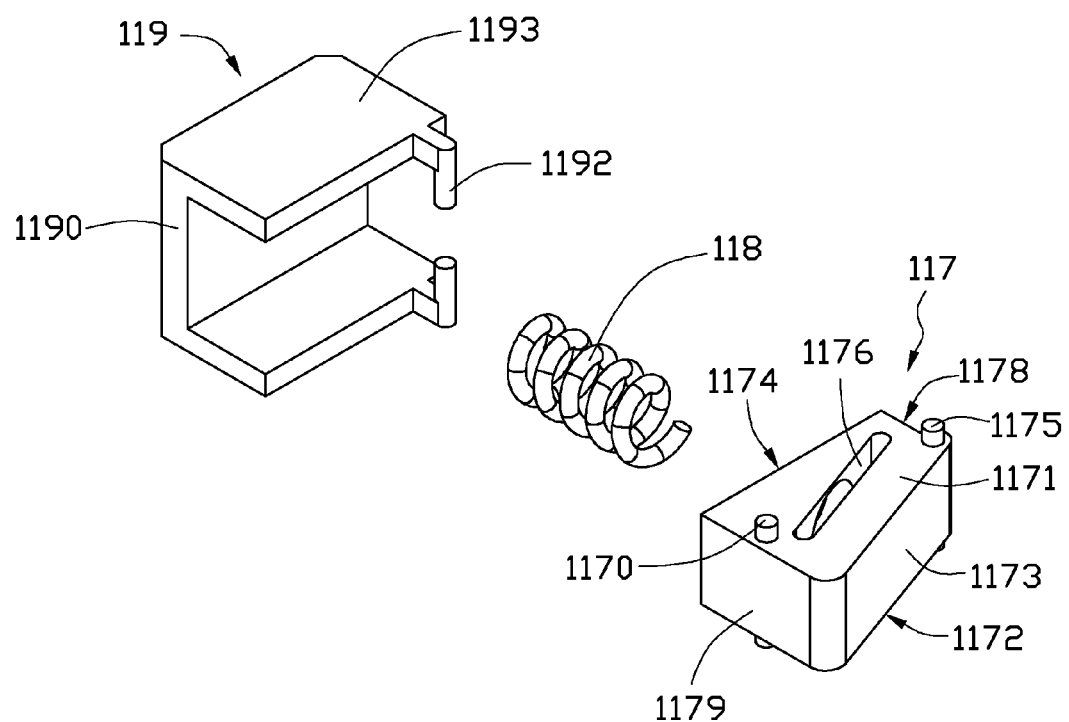
FIG. 9 is an enlarged view of a circled part IX of FIG. 2.
Figure 10:
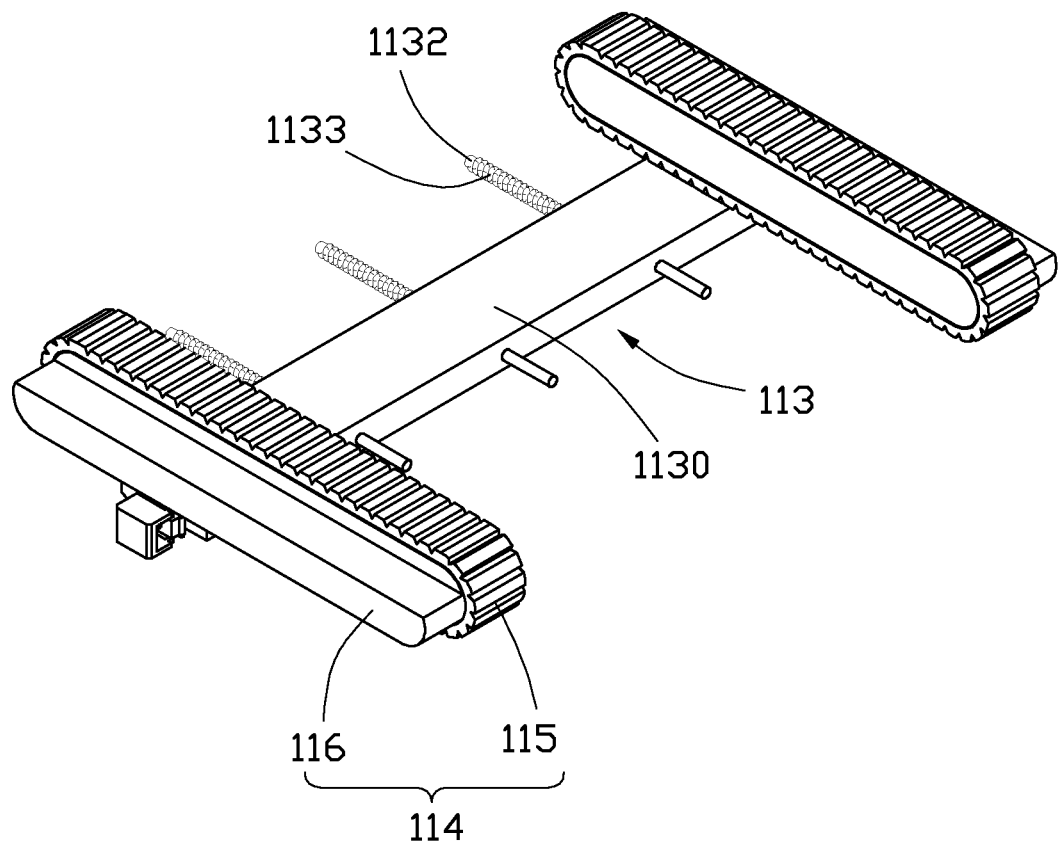
FIG. 10 is a partial general view of the connecting mechanism of FIG. 2.

FIGS. 8-10 show that the latching apparatus 112 includes a latching member 117, a second restoration member 118, and a button 119. The latching member 117 may be a hexahedron and includes a first surface 1171, a second surface 1172, a third surface 1173, a fourth surface 1174, a fifth surface 1178, and a sixth surface 1179. The first surface 1171 is opposite to the second surface 1172. The fifth surface 1178 is opposite to the sixth surface 1179, and both connect with the first surface 1171 and the second surface 1172. Each of the third surface 1173 and the fourth surface 1174 is connected with the first surface 1171, the second surface 1172, the fifth surface 1178 and the sixth surface 1179. The fourth side surface 1174 may be oblique to the third surface 1173, the fifth surface 1178 and the sixth surface 1179. The latching member 117 further includes two fixing shafts 1175. One position shaft 1170 and one fixing shaft 1175 protrude from the first side surface 1171, and the other position shaft 1170 and the other fixing shaft 1175 protrude from the second side surface 1172. The two fixing shafts 1175 extend along a same line which is perpendicular to the first side surface 1171 and the second side surface 1172. A first slideway 1176 is defined in the latching member 117 extending from the first side surface 1171 to the second side surface 1172. A receiving hole 177 is defined in the fourth side plate 1174 and is used to receive the sixth side surface 1179

The button 119 includes an operating portion 1190, two connecting portions 1193, and two latching portions 1192. The two connecting portions 1193 perpendicularly connect with two opposite sides of the operating portion 1190. Each latching portion 1192 is arranged on an end of the connecting portion 1193, which is away from the operating portion 1190 and is perpendicular to the connecting portion 1193. In one embodiment, the two latching portions 1192 are removable from the connecting portions 1193.

Figure 11:
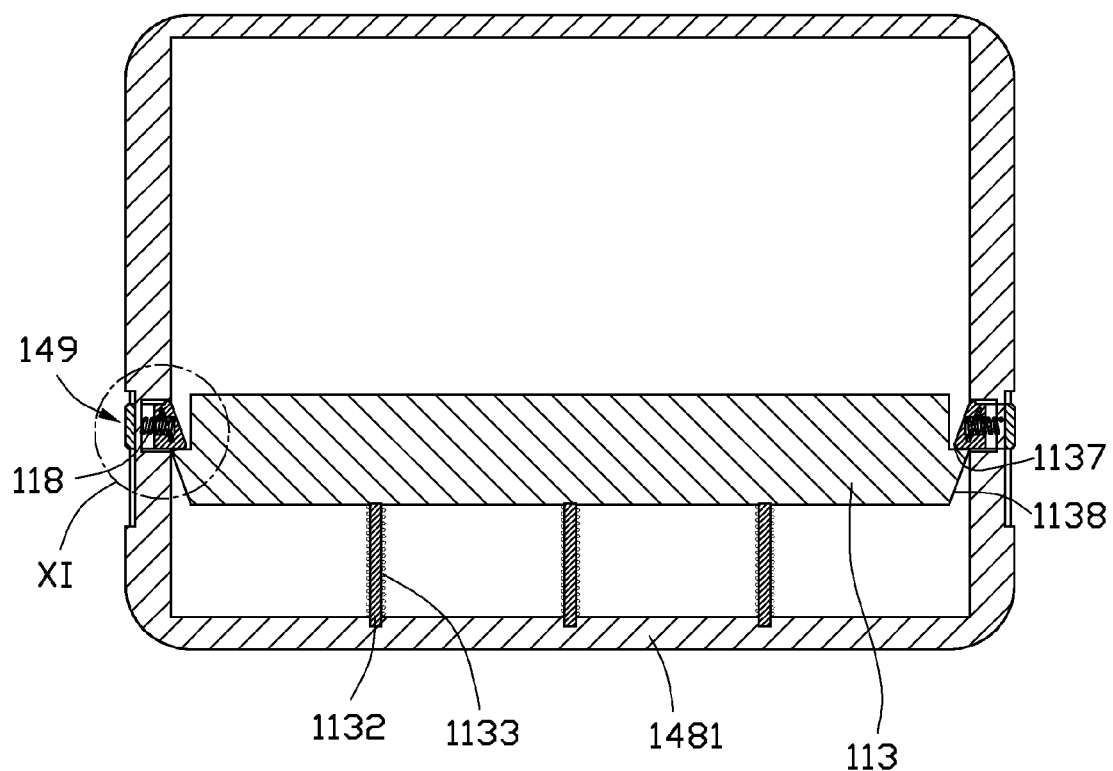
FIG. 11 is a sectional view of FIG. 1 along line XI-XI.
Figure 12:
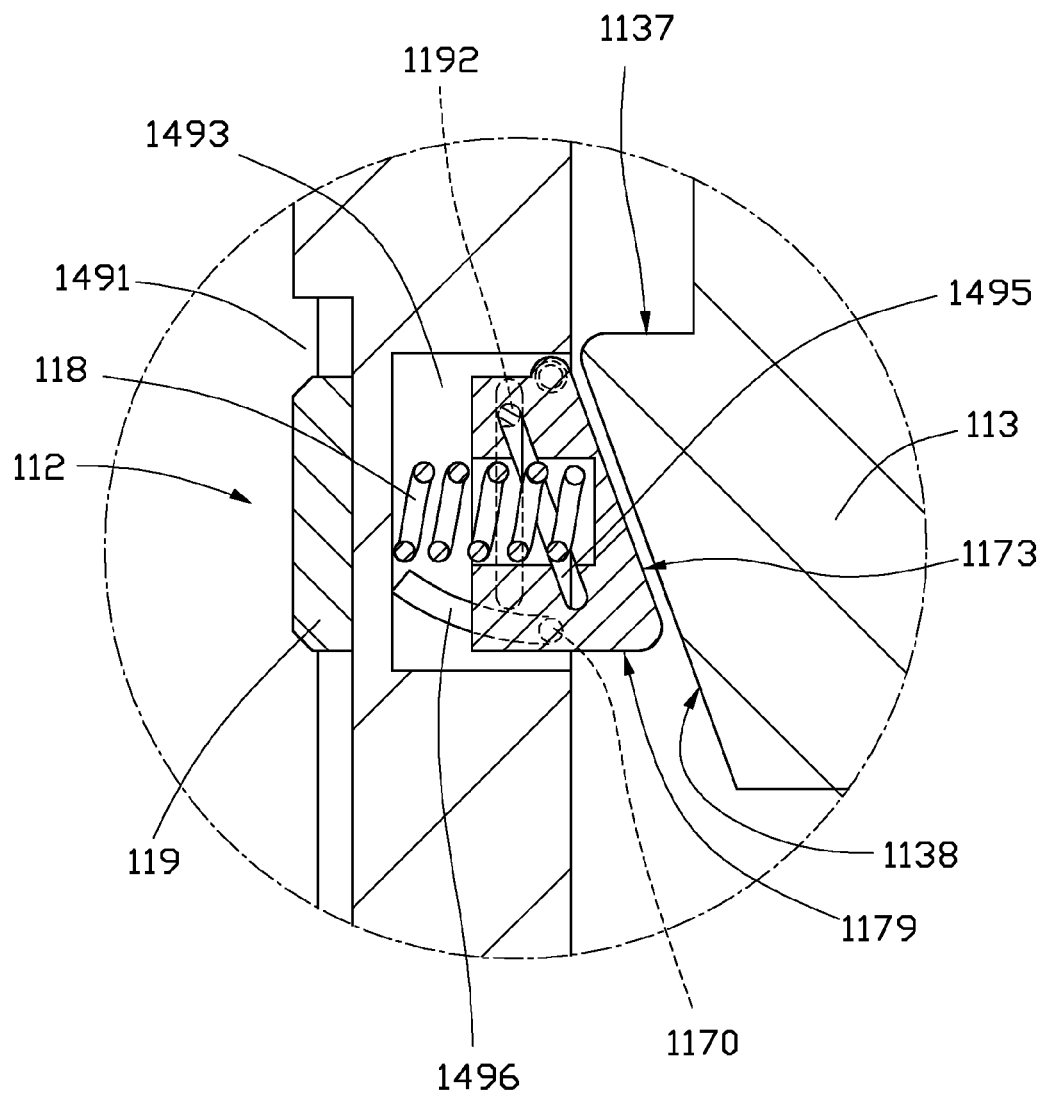
FIG. 12 is a sectional view of a position apparatus and a latching apparatus of the connecting mechanism, when the electronic device is in a second state.

FIGS. 10-12 show that one end of the second restoration member 118 is received in the receiving hole 177, and the other end of the second restoration member 118 is received in the third groove 1493. The latching member 117 is received in the third groove 1493. The third side surface 1173 faces the receiving space 140. The position shaft 1170 is received in the third slideway 1496. The fixing shaft 1175 is received in the fixing hole 1494 and capable of rotating in the fixing hole 1494. The operating portion 1190 is received in the first groove 1491. The two connecting portions 1193 are received in the second groove 1492. The two latching portions 1192 are received in the second slideway 1495 and latches in the first slideway 1176. The operating portion 1190 is capable of sliding in the two second grooves 1492 on the first spacing plate 1493a.

Figure 13:
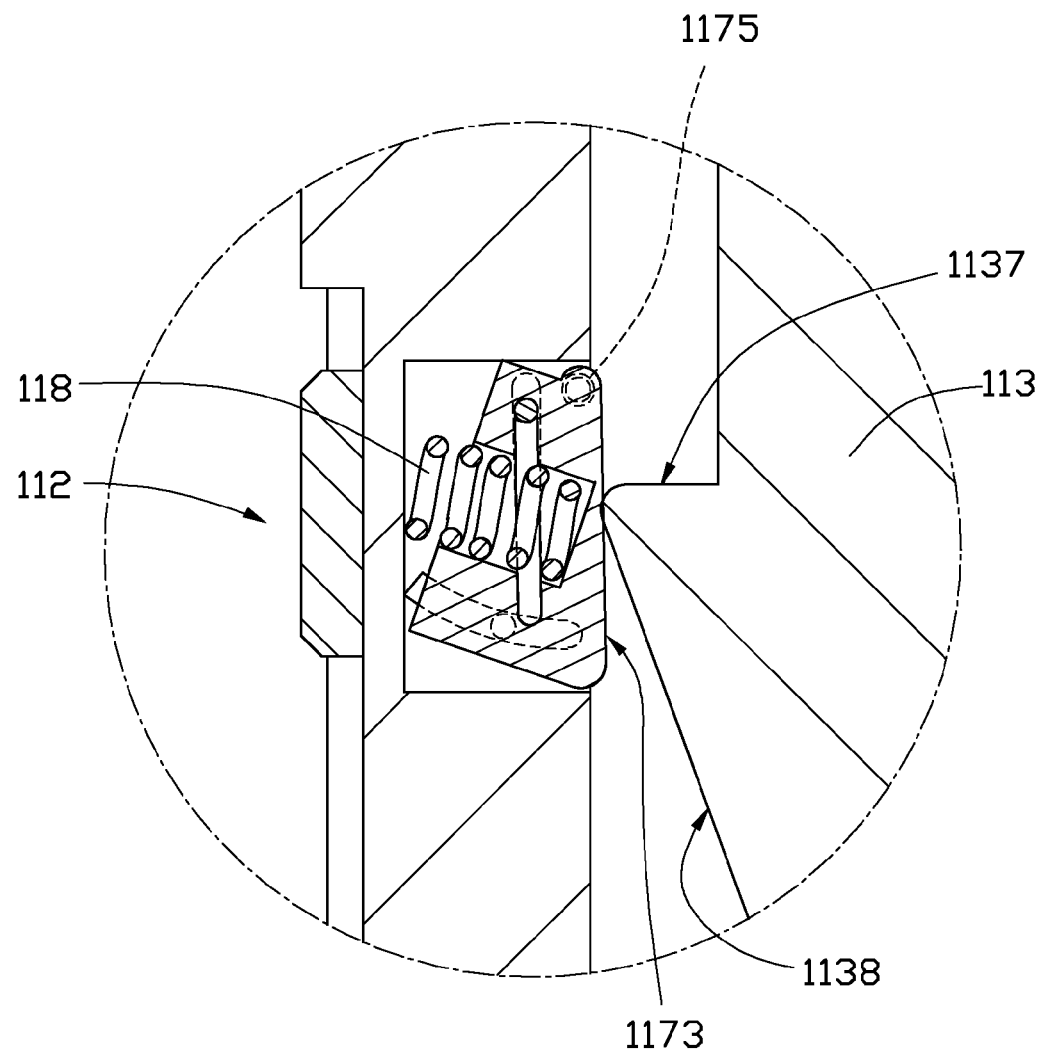
FIG. 13 is similar to FIG. 12, but showing the position apparatus latched to the latching apparatus, when the electronic device switches to a first state from the second state.
Figure 14:
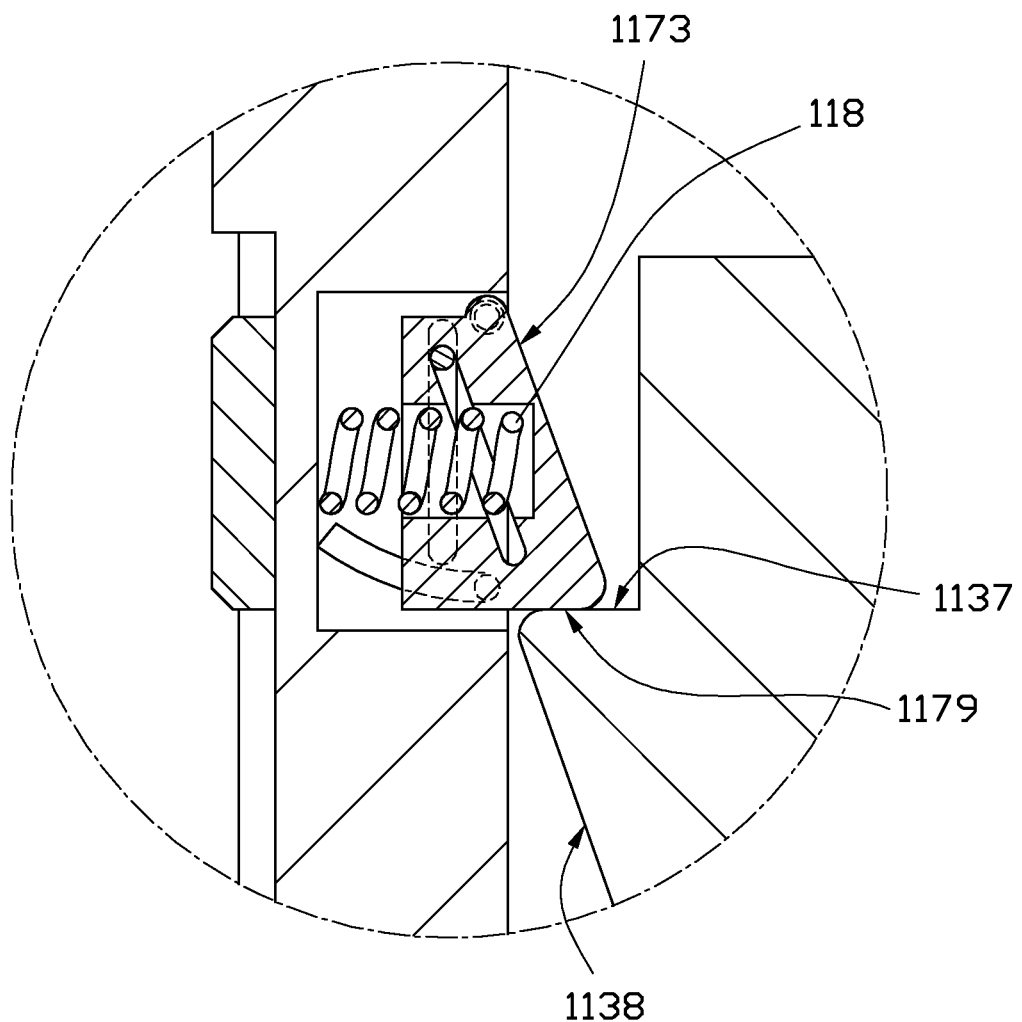
FIG. 14 is similar to FIG. 13, but showing the electronic device is in the first state.
Figure 15:
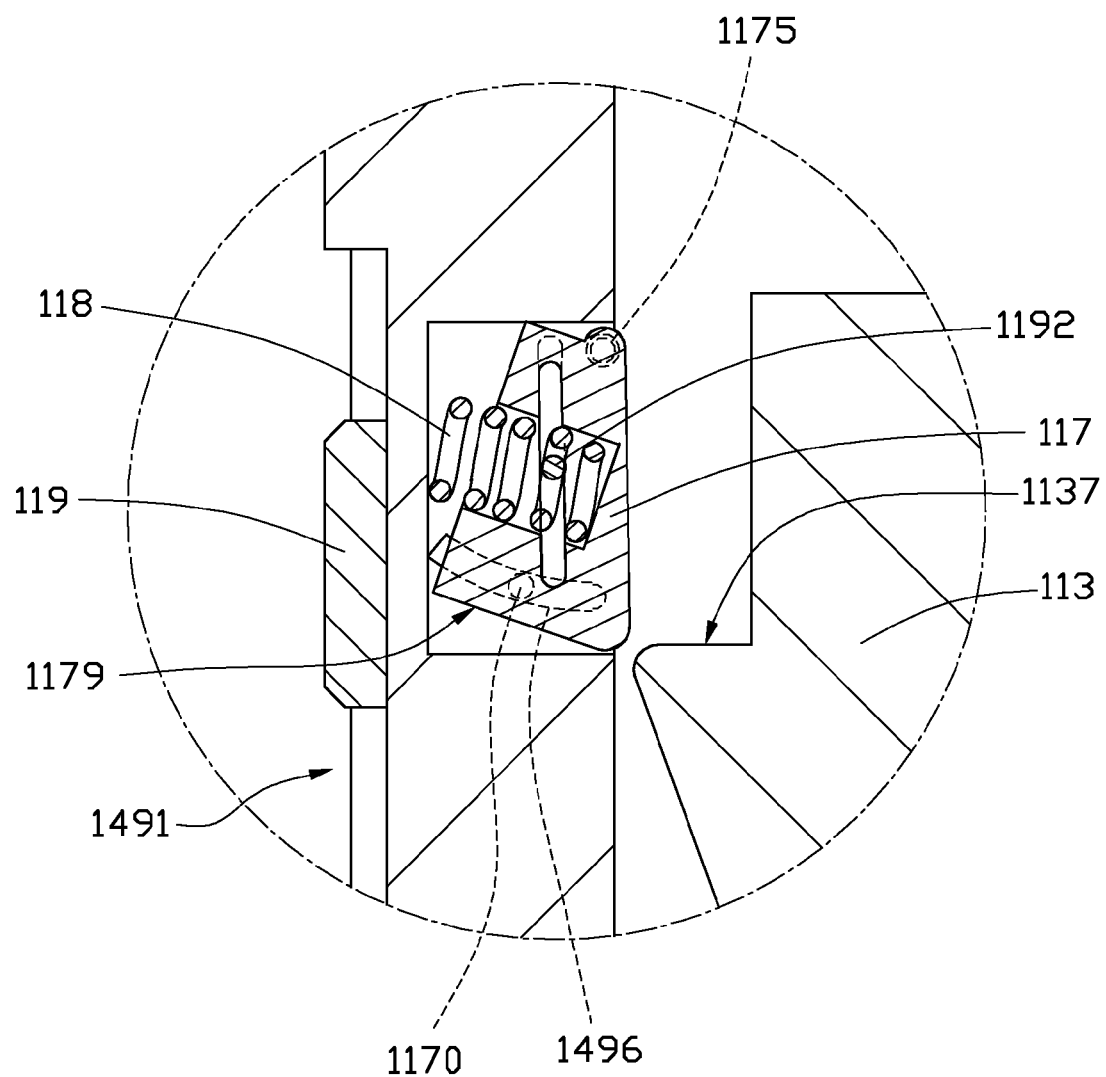
FIG. 15 is similar to FIG. 14, but showing the electronic device switching to the second state from the first state.

FIGS. 13-15 show that when the electronic device 99 is in the second working state, the cover 12 covers the housing 14 completely. The third side surface 1173 faces the guiding surface 1138. When the electronic device 99 switches to the first state from the second working state, the cover 12 is driven to slide on the supporting plate 147. The first rack 124 drives the continuous track 115 to rotate around the base 116. The rotation of the continuous track 115 drives the position apparatus 113 to move, and a intersection of the resisting surface 1137 and the guiding surface 1138 touches the third side surface 1173 and presses the latching member 117. The latching member 117 is driven to rotate along the first rotation direction with the fixing shaft 1175, as shown in FIG. 13. In this process, the second restoration member 118 is compressed. When the main plate 1130 moves continuously, the resisting surface 1137 moves away from the third side plate 1173 and releases the latching member 117, the second restoration member 118 drives the latching member 117 to reversely rotate along the second rotation direction and the resisting surface 1137 resists the sixth side surface 1179, so that the position apparatus 113 is latched. And the position apparatus 113 compresses the first restoration member 1133. Thus the electronic device 99 switches to the first state from the second state.

When the state of the electronic device 99 needs to be switched, the button 119 is manually pushed to slide along the two second grooves 1492. The two latching portions 1192 of the button 119 drive the latching member 117 to rotate along the first rotation direction. The two position shafts 1170 slide in the third slideway 1496 of the controlling portion 149, and then the sixth side surface 1179 is released from the resisting surface 1137. The first restoration member 1133 drives the position apparatus 113 to move, and then the position apparatus 113 drives the continuous track 115 to rotate around the base 116. The slider 123 is driven by the continuous track 115, thus the cover 12 covers the housing 14. The electronic device 99 switches to the second state.

In summary, the electronic device 99 remains stable in the first state by the connecting mechanism 11, and when the button 119 is slid, the position apparatus 113 is released by the latching apparatus 112, and the electronic device 99 switches to the second state automatically. It is convenient for user to switch the state of the electronic device 99.

It is to be understood that even though numerous characteristics and advantages of the present embodiments have been set forth in the foregoing description, together with details of the structures and functions of the embodiments, the disclosure is illustrative only; and changes may be in detail, especially in the matters of shape, size and arrangement of parts within the principles of the embodiments to the full extent indicated by the broad general meaning of the terms in which the appended claims are expressed.

What is claimed is:

1. An electronic device, comprising:
   a housing defining a receiving space by a plurality of side walls, an opening, the opening communicating with the receiving space;
   a cover movable relative to the housing; and
   a connecting mechanism connecting the housing with the cover, the connecting mechanism comprising:
   a transmission apparatus received in the receiving spacing and exposed out of the housing via the opening for engaging with the cover;
   a position apparatus assembling with the transmission apparatus and moving followed a motion of the transmission apparatus; and
   a latching apparatus arranged on one side wall of the housing to latch the position apparatus;
   wherein when the cover is moved to a first side of the housing, the position apparatus latches the latching apparatus, when the latching apparatus is released from the position apparatus, the cover slides to a second side opposite to the first side of the housing automatically.

2. The electronic device of claim 1, wherein the cover comprises a main body, a slider, and a first rack, the slider and the first rack are arranged at a bottom of the main body facing the housing, the slider contacts the housing and is slidable on the housing, the first rack is configured for engaging with the connecting mechanism.

3. The electronic device of claim 2, wherein the slider defines two sliding grooves, the two sliding grooves define moving directions of the cover when the cover moves relative to the housing.

4. The electronic device of claim 1, wherein the position apparatus comprises a first restoration member, when the cover is moved to the first side of the housing, the first restoration member is compressed.

5. The electronic device of claim 4, wherein the first restoration member drives the latching apparatus to release the position apparatus when the cover slides to the second side of the housing.

6. The electronic device of claim 5, wherein the transmission apparatus comprises a continuous track and a base, the continuous track surrounds the base and the continuous track is capable of rotating about the base.

7. The electronic device of claim 6, wherein the position apparatus further comprises a main plate and a position member, the first restoration member is sandwiched between another side wall which is connected with one side wall arranged the latching apparatus and the main plate, the position member is arranged on at least one end of the main plate and configured to engage with the latching apparatus.

8. The electronic device of claim 7, wherein the position member comprises a resisting surface and a guiding surface, when the electronic locates at the first side of the housing, the resisting surface latches the latching apparatus.

9. The electronic device of claim 1, further comprises a controlling portion arranged on the side wall to fix the latching apparatus, the controlling portion defines a first groove, a second groove, and a third groove, the third groove is defined on the side wall facing the receiving space, the first groove is opposite to the third groove, the first groove and the third groove are spaced by a spacing plate, and two second grooves are defined on opposite sides of the spacing plate.

10. The electronic device of claim 9, wherein the latching apparatus comprises a latching member rotatably received in the third groove, the latching member comprises a first side plate facing the receiving space and a second side plate opposite to the first side plate, and the resisting surface resists the second side plate when the cover is moved to the first side of the housing.

11. The electronic device of claim 10, wherein the latching apparatus further comprises a second restoration member, one end of the second restoration member is fixed in the second side plate, the other end of the second restoration member is fixed in a bottom of the third groove, the second restoration member drives the latching apparatus to extend from the third groove.

12. The electronic device of claim 11, wherein the third groove comprises an upper surface and a lower surface, the upper surface and the lower surface are both parallel to a bottom of the housing, a fixing hole, a first slideway, and a second slideway are defined in each of the upper surface and the lower surface, the first slideway is defined between the fixing hole and the third slideway.

13. The electronic device of claim 12, wherein the first slideway is parallel to the side wall and the second slideway is arcuate.

14. The electronic device of claim 12, wherein the latching apparatus further comprises an operating portion, two connecting portions, and two latching portions, two connecting portions extend from the operating portion, each latching portion is arranged on one connecting portion and perpendicular to the connecting portion, the operating portion is capable of sliding in the second grooves, and when the operating portion slides, the latching apparatus rotates about the fixing hole.

15. The electronic device of claim 14, wherein the latching apparatus further comprises a fixing shaft and two position shafts, two position shafts protrude out of the opposite side plate of the latching apparatus, the two position shafts are capable of sliding in the third slideway of the controlling portion.

16. An electronic device, comprising:
    a housing comprising an upper casing and a lower casing, the upper casing and the lower casing cooperatively defining a receiving space, the upper casing defining an opening at a top surface, the opening communicating with the receiving space;
    a cover covering the housing and movable relative to the housing; and a connecting mechanism connecting the housing with the cover, the connecting mechanism comprising:

a base arranged in the receiving space of the housing;

a continuous track supported by the base, and capable of rotating around the base, a portion of the continuous track exposing out of the housing via the opening to engage with cover;

a latching apparatus capable of rotating when operated by a user; and a position apparatus engageable with the continuous track so that the position apparatus is movable together with the motion of the continuous track when driven by the continuous track;

wherein when the position apparatus moves to the latching apparatus, the position apparatus is locked by the latching apparatus, and when the latching apparatus is operated to rotate, the position apparatus is released from the latching apparatus and drives the continuous track to rotate so as to drive the cover to move.

17. The electronic device of claim 16, wherein the position apparatus comprises a first restoration member, when the position apparatus moves to the latching apparatus, the first restoration member is compressed, and the first restoration member configures to drive the position apparatus to release the latching apparatus when the cover starts to move away the one side of the housing.

18. The electronic device of claim 17, wherein the position apparatus further comprises a main plate and a position member, the first restoration member is sandwiched between another side wall which is connected with the side wall arranged the latching apparatus and the main plate, the position member is arranged on at least one end of the main plate and configured to engage with the latching apparatus.

19. The electronic device of claim 18, wherein the position member comprises a resisting surface and a guiding surface, when the position apparatus moves to the latching apparatus, the resisting surface latches the latching apparatus.

20. The electronic device of claim 16, wherein the electronic device further comprises a controlling portion arranged on the side wall to fix the latching apparatus.

* * * * *